United States Patent
Maher

(10) Patent No.: US 8,383,523 B2
(45) Date of Patent: Feb. 26, 2013

(54) METHOD FOR TEXTURING SILICON WAFERS, TREATMENT LIQUID THEREFOR, AND USE

(75) Inventor: Izaaryene Maher, Freudenstadt (DE)

(73) Assignee: Gebr. Schmid GmbH (DE)

( * ) Notice: Subject to any disclaimer, the term of this patent is extended or adjusted under 35 U.S.C. 154(b) by 0 days.

(21) Appl. No.: 13/224,821

(22) Filed: Sep. 2, 2011

(65) Prior Publication Data

US 2012/0034725 A1 Feb. 9, 2012

Related U.S. Application Data

(63) Continuation of application No. PCT/EP2010/052677, filed on Mar. 3, 2010.

(30) Foreign Application Priority Data

Mar. 3, 2009 (DE) .......................... 10 2009 012 827

(51) Int. Cl.
*C23F 1/00* (2006.01)
*C25F 3/00* (2006.01)
*C03C 15/00* (2006.01)
*C03C 25/68* (2006.01)
*H01L 21/00* (2006.01)
*H01L 21/461* (2006.01)
*H01L 21/302* (2006.01)

(52) U.S. Cl. ... 438/753; 438/689; 438/48; 257/E31.002; 216/96

(58) Field of Classification Search .......................... None
See application file for complete search history.

(56) References Cited

U.S. PATENT DOCUMENTS

| 6,451,218 | B1 | 9/2002 | Holdermann |
| 7,910,393 | B2 * | 3/2011 | Kim et al. ........................ 438/71 |
| 8,222,149 | B2 * | 7/2012 | Chang ........................... 438/700 |
| 8,252,423 | B2 * | 8/2012 | Sakayori et al. ............ 428/473.5 |
| 2005/0247674 | A1 | 11/2005 | Kubelbeck et al. |
| 2010/0068889 | A1 | 3/2010 | Stockum et al. |
| 2011/0250762 | A1 * | 10/2011 | Barr et al. ..................... 438/745 |
| 2012/0034725 | A1 * | 2/2012 | Maher ............................. 438/57 |

FOREIGN PATENT DOCUMENTS

| DE | 102007026081 A1 | 11/2008 |
| EP | 1826829 A2 | 8/2007 |
| JP | 2005 019605 A | 1/2005 |

OTHER PUBLICATIONS

Zubel et al. "The Effect of Alcohol Additives on Etching Characteristics in KOH Solutions", Sensors and Actuators, A. Elsevier Sequoia S.A., Bd. 101, No. 3, Oct. 30, 2002.

Yang et al. "Effects of Mechanical Agitation and Surfactant Additive on Silicon Anisotropic Etching in Alkaline KOH Solution", Sensors and Actuators, A. Elsevier Sequoia S.A., Bd. 119, No. 1, 28, Mar. 28, 2005.

International Preliminary Report on Patentability issued in connection with International Application No. PCT/EP2010/052677.

* cited by examiner

*Primary Examiner* — Seahvosh Nikmanesh
*Assistant Examiner* — Evren Seven
(74) *Attorney, Agent, or Firm* — Akerman Senterfitt

(57) ABSTRACT

In a method for the treatment of silicon wafers in the production of solar cells, a treatment liquid is applied to the surface of the silicon wafers for the purpose of texturization thereof. The treatment liquid contains, as additive, ethyl hexanol or cyclohexanol in an amount ranging from 0.5% to 3%, by weight.

6 Claims, No Drawings

METHOD FOR TEXTURING SILICON WAFERS, TREATMENT LIQUID THEREFOR, AND USE

CROSS-REFERENCE TO RELATED APPLICATIONS

This application is a continuation of PCT Application No. PCT/EP2010/052677, filed Mar. 3, 2010, and claims priority to DE 10 2009 012 827.1 filed Mar. 3, 2009, the disclosures of which are hereby incorporated by reference in their entirety.

FIELD OF APPLICATION AND PRIOR ART

The invention relates to a method for treating silicon wafers in the production of solar cells and to a treatment liquid suitable for this purpose. Furthermore, the invention relates to the use of a treatment liquid of the invention for carrying out said method.

For example, DE 102007026081 A1 discloses the texturization of silicon wafers in the production of solar cells. For this purpose, a treatment liquid is applied to the wafer surface, by which means pyramidal protrusions are formed on the silicon surface. These improve the coupling of light into the silicon wafer and subsequently into the solar cell with concomitant improvement of their energy yield. The treatment liquid can contain isopropanol as added etch inhibitor.

OBJECT AND ITS ACHIEVEMENT

It is an object of the invention to provide a method as stated above and also a treatment liquid suitable for this purpose, by means of which problems encountered with the prior art can be obviated and, in particular, quicker and better treatment, for example texturization, can be achieved.

This object is achieved by a method having the features defined in claim 1, a treatment liquid having the features defined in claim 7, and the use of the liquid in the method. Advantageous and preferred embodiments of the invention are subject matter of the other claims and are explained below in greater detail. The wording of the claims refers expressly to the contents of the description.

The treatment liquid, which is advantageously an alkaline treatment liquid, contains an additive. This additive can be an added etch inhibitor and is according to the invention an ethyl hexanol or cyclohexanol. The two additives can advantageously be used as mutual alternatives, but in some circumstances they can be used both together. The advantage of these specific additives in the treatment liquid resides in the fact, that by reason of their higher boiling points, it will be possible, in a further embodiment of the invention, to carry out the method at a higher temperature than otherwise possible.

By reason of the fact that the boiling point of ethyl hexanol is 182° C. and that of cyclohexanol is 161° C., it is clearly possible for the treatment liquid mixed therewith to be used at a higher temperature when carrying out texturization. On account of the low boiling point of 82° C. of the prior additive isopropanol, it requires either constant replenishment, in order not to obtain unsatisfactory texturization results, or the temperature has had to be kept at 80° C. or even lower, in which case the procedure involved for effecting treatment, i.e., the texturization, takes considerably longer, which may also be regarded as being highly detrimental. Using the additives of the invention, it is thus possible to effect texturization at 80° C. or higher, for example at approximately 90° C. The duration of treatment can then be from 10 to 15 minutes and advantageously approximately 11 minutes. The silicon wafers can then be removed from a bath containing the treatment liquid and subsequently rinsed and dried and processed further.

In another embodiment of the invention, the silicon wafer can be agitated in the treatment liquid, which likewise improves or accelerates texturization. Provision may also be made in this case for relative movement to take place between the silicon wafer and the treatment liquid, that is to say, for the treatment liquid to be kept in motion or to exhibit an internal fluid current.

The object of the invention is further achieved by the use of the method of the invention, more particularly for effecting treatment of silicon wafers in the production of solar cells.

The treatment liquid of the invention can contain water as a further component in addition to the additive in the form of ethyl hexanol or cyclohexanol. An additive can be added in an amount of from 0.3% to 4%, by weight, and particularly advantageously in an amount of from 0.5 to 3%, by weight.

In yet another embodiment of the invention, the treatment liquid can additionally contain KOH. The proportion thereof can be from 1.5% to 5%, by volume, and advantageously from 2% to 3%, by volume.

Another independent aspect of the invention is the use of a treatment liquid of the invention for the execution of a method, more particularly for execution of a method such as is described above.

These and other features are disclosed in the claims, wherein the individual features can be achieved singly or multiply in the form of subcombinations in any one embodiment of the invention and in other fields and can intrinsically form advantageous and patentable embodiments, for which protection is herein claimed.

As regards the execution of the process of the invention, reference is likewise made to DE 102007026081 A1, the relevant subject matter of which is included in the present description by reference. In said citation, FIGS. 1 and 2 illustrate how such a method can be carried out, and it can accordingly be equally well carried out with the process parameters and quantities stated herein.

The invention claimed is:

1. A method for the treatment of silicon wafers for the production of solar cells, wherein a treatment liquid is applied to a surface of said silicon wafers for the purpose of texturization of said surface, wherein said treatment liquid contains ethyl hexanol or cyclohexanol as additive.

2. The method according to claim 1, wherein said method is carried out at a temperature ranging from 80° C. to 95° C.

3. The method according to claim 2, wherein said method is carried out at a temperature of approximately 90° C.

4. The method according to claim 1, wherein said treatment liquid is applied to the silicon wafer for a period ranging from 8 minutes to 20 minutes.

5. The method according to claim 4, wherein said treatment liquid is applied to the silicon wafer for a period ranging from 10 minutes to 13 minutes.

6. The process according to claim 1, wherein said silicon wafer is agitated in the treatment liquid and is moved relatively thereto.

* * * * *